United States Patent
Jang

(12) 
(10) Patent No.: US 6,197,658 B1
(45) Date of Patent: *Mar. 6, 2001

(54) SUB-ATMOSPHERIC PRESSURE THERMAL CHEMICAL VAPOR DEPOSITION (SACVD) TRENCH ISOLATION METHOD WITH ATTENUATED SURFACE SENSITIVITY

(75) Inventor: Syun-Ming Jang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/182,776

(22) Filed: Oct. 30, 1998

(51) Int. Cl.[7] .................................................. C23C 16/40
(52) U.S. Cl. ..................... 438/424; 438/431; 438/787; 438/790; 427/255.37
(58) Field of Search .................................... 438/424, 431, 438/787, 790; 427/255.37

(56) References Cited

U.S. PATENT DOCUMENTS

| | | | |
|---|---|---|---|
| 4,666,556 | 5/1987 | Fulton et al. | 156/643 |
| 5,447,884 * | 9/1995 | Fahey et al. | 437/67 |
| 5,665,635 * | 9/1997 | Kwon et al. | 438/427 |
| 5,726,090 | 3/1998 | Jang et al. | 438/435 |
| 5,731,241 | 3/1998 | Jang et al. | 438/424 |
| 5,741,740 | 4/1998 | Jang et al. | 438/435 |
| 5,817,566 * | 10/1998 | Jang et al. | 438/424 |
| 5,869,384 * | 2/1999 | Yu et al. | 438/431 |

* cited by examiner

*Primary Examiner*—Timothy Meeks
(74) *Attorney, Agent, or Firm*—George O. Saile; Stephen B. Ackerman; Stephen G. Stanton

(57) ABSTRACT

A method for filling a trench within a silicon substrate. There is first provided a silicon substrate having a trench formed therein. There is then formed upon the substrate and within the trench a gap filling silicon oxide trench fill layer employing an ozone assisted thermal chemical vapor deposition (SACVD) method. There is then carried out a densification of the gap filling silicon oxide trench fill layer by annealing in an oxidizing atmosphere at an elevated temperature. Finally, the gap filling silicon oxide trench fill layer is planarized by chemical mechanical polish (CMP) planarization to form the silicon oxide trench filling layer with attenuated surface sensitivity and with an enhanced bulk quality and reduced trench recess at corners.

17 Claims, 3 Drawing Sheets

SUB-ATMOSPHERIC PRESSURE THERMAL CHEMICAL VAPOR DEPOSITION (SACVD) TRENCH ISOLATION METHOD WITH ATTENUATED SURFACE SENSITIVITY

BACKGROUND OF THE INVENTION

1. Field of the Invention

The present invention relates generally to methods for forming trench fill layers within trenches within substrates employed in microelectronics fabrication. More particularly, the present invention relates to methods for forming gap filling trench fill layers within trenches within substrates employed in microelectronics fabrication.

2. Description of the Related Art

In the art of microelectronics fabrication, integrated circuits are formed from semiconductor substrates within and upon whose surfaces are formed resistors, transistors, diodes, capacitors and other electrical circuit elements. The electrical circuit elements are connected internally and externally to the semiconductor substrate upon which they are formed through patterned conductor layers which are separated by patterned and/or blanket dielectric layers.

As integrated circuit device technology has advanced and integrated circuit device dimensions have decreased, it has become increasingly common within advanced integrated circuits to employ electrical isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench isolation region formed from a trench fill dielectric layer formed within a trench. Within the chemical mechanical polish (CMP) planarizig methods, means and materials are required to insure that when the desired degree of planarization is achieved the planarizing process is brought to completion without damage to underlying regions of the microelectronics fabrication.

Trench isolation regions nominally co-planar with active semiconductor regions within semiconductor substrates are desirable since they optimize, when subsequently forming patterned layers upon those nominally co-planar regions, the limited depth of focus typically obtained with advanced photoexposure tooling employed in the microelectronics fabrication art.

When forming within advanced integrated circuits trench isolation regions within isolation trenches, it has become common to employ as trench fill dielectric layers gap filling silicon oxide layers formed employing ozone assisted satmospheric pressure thermal chemical vapor deposition (SACVD) methods. Silicon oxide layers formed employing such methods are desirable since such silicon oxide layers typically possess the inherently superior gap filling characteristics desirable for trenches of limited dimensions typically encountered in advanced integrated circuit microelectronics fabrication.

While gap filling silicon oxide layers formed employing ozone assisted sub-atmospheric pressure thermal chemical vapor deposition (SACVD) methods are desirable as trench fill layers within trenches within advanced integrated circuit microelectronics fabrications, methods through which are formed such gap filling silicon oxide layers are not entirely without problems. Specifically, it is known in the art of integrated circuit microelectronics fabrication that gap filling silicon oxide layers formed employing ozone assisted subatmospheric pressure thermal chemical vapor deposition (SACVD) methods exhibit a surface sensitivity dependent upon the substrate layers upon which are formed those gap filling silicon oxide layers. In particular, when employing as substrate layers thermally grown silicon oxide layers formed within silicon semiconductor substrates, gap filling silicon oxide layers formed employing ozone assisted sub-atmospheric pressure thermal chemical vapor deposition (SACVD) methods exhibit inhibited formation rates in comparison with otherwise equivalent gap ffling silicon oxide layers formed employing ozone assisted sub-atmospheric pressure thermal chemical vapor deposition (SACVD) methods upon substrate layers other than thermally grown silicon oxide layers. The gap filing silicon oxide layers formed employing ozone assisted sub-atmospheric pressure thermal chemical vapor deposition (SACVD) methods upon the thermally grown silicon oxide layers also typically exhibit inferior bulk quality (as determined by wet etch rates in dilute hydrofluoric acid) in comparison with otherwise equivalent gap filling silicon oxide layers formed employing ozone assisted sub-atmospheric pressure thermal chemical vapor deposition (SACVD) methods upon substrate layers other than thermally grown silicon oxide layers.

Inhibited formation rates within isolation trenches within semiconductor substrates of gap filling silicon oxide trench fill layers formed employing ozone assisted sub-atmospheric pressure thermal chemical vapor deposition (SACVD) methods are undesirable since there is then formed within those isolation trenches gap filling silicon oxide layers which are particularly susceptible to dishing when subsequently planarized employing chemical mechanical polish (CMP) planarizing methods.

The planarizing methods typically remove not only silicon oxide trench fill layer material but any other silicon oxide materials such as thermal silicon oxide, conformal silicon oxide, etc. Therefore, it is customary to interpose a non-reactive substance such as silicon nitride between the underlying layers and such gap filling silicon oxide trench fill layers to act as a barrier or stop layer to prevent further removal of material as a consequence of the planarizing process, thus adding cost and complexity to the microelectronics fabrication. Also, inferior bulk quality of such gap filling silicon oxide trench fill layers often compromises the dielectric properties of such gap filling silicon oxide trench fill layers. Finally, enhanced surface roughness of such gap filling silicon oxide trench fill layers is undesirable since enhanced surface roughness of such gap filling silicon oxide trench fill layers often provides gap filling silicon oxide trench fill layers of enhanced porosity.

It is thus towards the goal of forming within advanced integrated circuit microelectronics fabrications gap filling silicon oxide trench fill layers formed employing ozone assisted subatmospheric pressure thermal chemical vapor deposition (SACVD) methods with enhanced bulk quality while attenuating a surface sensitivity when forming those gap filling silicon oxide trench fill layers, that the present invention is generally directed.

Methods and materials through which silicon oxide layers may be formed with desirable properties within integrated circuit microelectronics fabrications are known in the art of integrated circuit microelectronics fabrication.

For example, Jang et al, in U.S. Pat. No. 5,731,241, disclose a method for protecting a trench fill silicon oxide layer from excessive etching during multiple etching steps when forming the trench fill silicon oxide layer. The method employs a sacrificial silicon oxide layer formed selectively, while employing a sub-atmospheric pressure chemical vapor deposition (SACVD) method, upon a silicon oxide trench fill layer within a trench within a silicon substrate, wherein the sacrificial silicon oxide layer has a greater differential etch rate over the trench fill region and functions as a sacrificial layer to protect the trench fill silicon oxide.

Further, Jang et al., in U.S. Pat. No. 5,726,090, disclose a method for enhancing gap filling characteristics of ozone assisted subatmospheric pressure thermal chemical vapor deposited (SACVD) silicon oxide dielectric layers formed upon thermal silicon oxide trench liner layers within semiconductor substrates within semiconductor integrated circuit microelectronics fabrications. The method employs an intermediate silicon oxide trench liner layer formed upon the thermal silicon oxide trench liner layer prior to forming the ozone assisted sub-atmospheric pressure thermal chemical vapor deposited (SACVD) silicon oxide dielectric layer over the thermal silicon oxide trench liner layer, where the intermediate silicon oxide trench liner layer is treated with a nitrogen plasma prior to forming the ozone assisted sub-atmospheric pressure thermal chemical vapor deposited (SACVD) silicon oxide dielectric layer thereupon.

Still further, Fahey, in U.S. Pat. No. 5,447,884, discloses a method for voids in a trench fill layer by forming an isolation trench liner layer of silicon nitride within a silicon isolation trench, while forming the silicon nitride layer as thin as 5 nanometers and by densification of a trench fill silicon oxide layer in a pyrogenic oxide annealing step carried out at 800 degrees centigrade.

Finally, Fulton, in U.S. Pat. No. 4,666,556, discloses a method for forming a conformal etch resistant layer of silicon dioxide within a trench wherein first a conformal layer of polysilicon is formed within the trench. Then the polysilicon layer is converted to a layer of silicon dioxide by thermal oxidation, thus filing the trench with silicon dioxide.

Desirable in the art are additional methods through which trenches within substrates employed within integrated arctic microelectronics fabrications may be filled with gap filling silicon oxide trench fill layers formed employing ozone assisted sub-atmospheric pressure thermal chemical vapor deposition (SACVD) methods, while: (1) attenuating a surface sensitivity when forming those gap filling silicon oxide trench fill layers; and (2) providing gap filling silicon oxide trench fill layers with enhanced bulk quality (as determined, for example, employing etch rates in dilute hydrofluoric acid). It is towards these goals that the present invention is more specifically directed.

SUMMARY OF THE INVENTION

A first object of the present invention is to provide a method through which a trench within a substrate employed in integrated circuit microelectronics fabrication may be filled with a gap filling silicon oxide trench fill layer formed employing a sub-atmospheric pressure thermal chemical vapor deposition (SACVD) method.

A second object of the present invention is to provide a method in accord with the first object of the present invention, where there is attenuated a surface sensitivity when forming the gap filling silicon oxide trench fill layer.

A third object of the present invention is to provide a method in accord with the first object of the present invention or the second object of the present invention, where there is provided the gap filling silicon oxide trench fill layer with enhanced bulk quality (as determined by etch rate in dilute hydrofluoric acid).

A fourth object of the present invention is to provide a method in accord with the first object of the present invention, the second object of the present invention or the third object of the present invention, where the substrate is a semiconductor substrate and the trench is an isolation trench within the semiconductor substrate.

A fifth object of the present invention is to provide a method in accord with the firs object of the present invention, the second object of the present invention, the third object of the present invention, or the fourth object of the present invention, which method is readily commercially implemented.

In accord with the objects of the present invention, there is provided by the present invention a method for forming within a trench within a silicon substrate employed in microelectronics fabrication a gap filling silicon oxide trench fill layer. To practice the method of the present invention, there is first provided a trench within a silicon substrate. There is then formed upon the silicon substrate and within the trench a gap filling silicon oxide trench fill layer formed employing an ozone assisted subatmospheric pressure thermal chemical vapor deposition (SACVD) method. There is then employed an annealing step in an oxidizing environment at an elevated temperature to density the gap filling silicon oxide trench fill layer. There is then performed a chemical mechanical polish (CMP) planarizing method wherein the silicon substrate acts as a stop layer to produce within the trench a densified gap filling silicon oxide trench fill layer with attenuated surface roughness and enhanced bulk quality and reduced trench recesses at corners.

The present invention provides a method through which there may be formed within a trench within a substrate employed in integrated circuit microelectronics fabrication a gap filling silicon oxide trench fill layer formed employing a sub-atmospheric pressure thermal chemical vapor deposition (SACVD) method, where there is attenuated a surface sensitivity when forming the gap filling silicon oxide trench fill layer and where there is provided a gap filling silicon oxide trench fill layer with enhanced bulk quality (as determined employing etch rate in dilute hydrofluoric acid). The method of the present invention realizes these objects by forming within a silicon substrate a trench which is then subsequently filled with a gap filling silicon oxide trench fill layer formed employing an ozone assisted subatmospheric pressure thermal chemical vapor deposition (SACVD) method.

The method of the present invention may be employed where the substrate is a semiconductor substrate and where the trench is an isolation trench within the semiconductor substrate. Provided that the semiconductor substrate is a silicon semiconductor substrate, the method of the present invention does not discriminate with respect to the nature of a trench which is formed within the substrate. Thus, the method of the present invention may be employed where the substrate is a semiconductor substrate and the trench is an isolation trench within the semiconductor substrate.

The method of the present invention is readily commercially implemented. The method of the present invention provides a novel ordering of integrated circuit microelectronics fabrication methods such as silicon deposition, silicon oxide chemical vapor deposition, patterning, and similar methods which are otherwise generally known in the art of microelectronics fabrication. Thus, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming, while attenuating a surface sensitivity and while providing an enhanced bulk quality, a gap filling silicon oxide trench fill layer formed employing an ozone assisted sub-atmospheric pressure thermal chemical vapor deposition (SACVD) method within a trench within a substrate employed in integrated circuit microelectronics fabrication. To achieve the foregoing objects, the method of the present invention provides that there is formed a trench within a silicon substrate. There is then formed a gap filling silicon oxide trench fill layer upon the silicon substrate, employing ozone assisted sub-atmospheric pressure thermal chemical vapor deposition (SACVD) employing tetra-ethyl-ortho-silicate (TEOS) as a silicon source material. There is then carried out an annealing step in an oxidizing atmosphere at an elevated temperature to densify the gap filling silicon oxide trench fill layer. There is then planarized the gap filling silicon oxide trench fill layer by a chemical mechanical polish (CMP) planarizing method to form a planar region of the gap filling silicon oxide trench fill layer within the trench within the silicon substrate.

Although the preferred embodiments of the method of the present invention illustrate the method of the present invention in forming, while attenuating a surface sensitivity and while providing an enhanced bulk quality, a pair of patterned planarized gap filling silicon oxide trench fill layers within a pair of trenches within a silicon substrate employed in integrated circuit microelectronics fabrication, the method of the present invention may also be employed in forming, while attenuating a surface sensitivity and while providing an enhanced bulk quality, the gap filling silicon oxide trench fill layer or the patterned planarized gap filling silicon oxide trench fill layers of the method of the present invention within trenches other than isolation trenches within silicon substrates other than silicon semiconductor substrates. The method of the present invention may be employed in forming, while attenuating a surface sensitivity and while providing an enhanced bulk quality and reduced trench recess at corners and edges, the gap filling silicon oxide trench fill layer or the patterned planarized gap filing silicon oxide trench fill layers of the present invention into trenches within silicon substrates including but not limited to silicon semiconductor substrates, silicon solar cell substrates and silicon charge-coupled device (CCD) substrates.

First Preferred Embodiment

Figure 1:
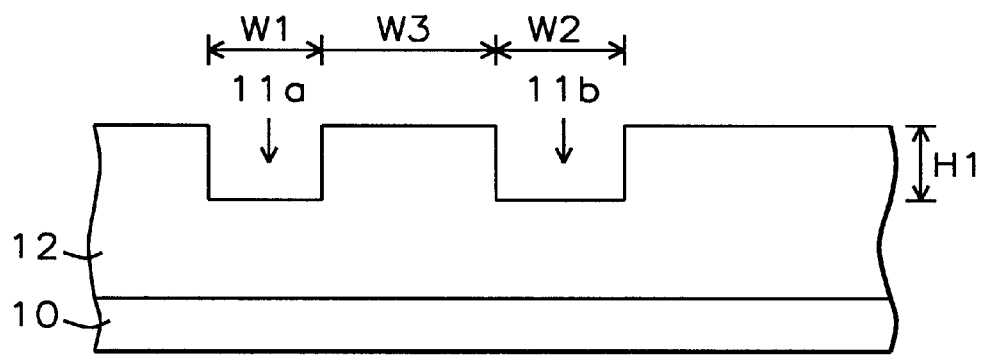
FIG. 1, FIG. 2, FIG. 3 and FIG. 4 show a series of schematic cross-sectional diagrams illustrating the results of progressive stages in forming within a trench within a silicon substrate employed in a microelectronics fabrication a patterned planarized gap filling silicon oxide trench fill layer, while attenuating a surface se and while providing enhanced bulk quality, in accord with a more general embodiment of the method of the present invention which represents a first preferred embodiment of the present invention.

Referring now to FIG. 1 to FIG. 4, there is shown a series of schematic cross-sectional diagrams illustrating the results of progressive stages of forming, while attenuating a sensitivity and while providing an enhanced bulk quality, a pair of patterned planarized gap filling silicon oxide trench fill layers within a pair of isolation trenches within a silicon substrate in accord with a first preferred embodiment of the present invention. Shown in FIG. 1 is a schematic cross-sectional diagram of the silicon substrate at an early stage in its fabrication.

Shown in FIG. 1 is a substrate 10 having formed thereupon a silicon layer 12 wherein there has been formed a pair of trenches 11a and 11b of width W1 and W2 of a depth H1 separated by a width W3. The pair of trenches 11a and 11b is formed by patterning methods conventional in the art of microelectronics fabrication.

Although not specifically shown in FIG. 1, the silicon layer 12 may be of a composite nature in that it may consist of one or more layers of silicon upon a silicon base, as well as any other base as long as the top layer is silicon of a thickness greater than the depth H1 of the trench. Although the method of the present invention may be practiced employing silicon substrates and/or layers of either dopant polarity, any dopant concentration and various crystallographic orientations, within the first preferred embodiment of the method of the present invention the silicon substrate 10 is preferably a (100) silicon substrate having an N- or P-doping. As is illustrated in FIG. 1, the widths W1, W2 and W3 are preferably from a minimum width of about 0.3 microns with no upper width limit, and the trench depth H1 is preferably from about 3000 to about 5000 angstroms.

Figure 2:
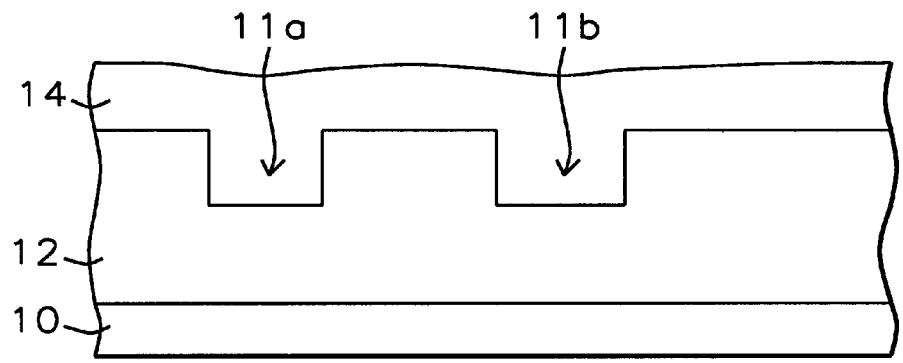

Referring now to FIG. 2, there is shown a schematic cross-sectional diagram illustrating the results of further processing of the substrate 10 whose schematic cross-sectional diagram is illustrated in FIG. 1. Shown in FIG. 2 is the formation of a gap filling silicon oxide trench fill layer 14 upon the silicon layer 12 and within the pair of trenches 11a and 11b. Within the first preferred embodiment of the method of the present invention, the gap filling silicon oxide trench fill layer 14 is preferably formed by ozone assisted sub-atmospheric pressure thermal chemical vapor deposition (SACVD) employing tetra-ethyl-ortho-silicate (TEOS) as a silicon source gas. The gap filling silicon oxide trench fill layer 14 is formed to a thickness greater than the trench depth H1. Subsequent to the formation of the gap filling silicon oxide trench fill layer 14, the silicon substrate microelectronics fabrication is densified by annealing in an oxidizing atmosphere at an elevated temperature.

Other parameters employed in forming the gap filling silicon oxide trench fill layer 14 employing the ozone assisted sub-atmospheric pressure thermal chemical vapor deposition (SACVD) method include: (1) a reactor chamber pressure of from about 400 to about 600 torr; (2) a substrate 10 temperature of from about 360 to about 440 degrees centigrade; (3) an ozone concentration of from about 8 to about 14 molar per cent in a helium carrier gas; (4) an oxygen gas flow rate of from about 4000 to about 6000 standard cubic centimeters per minute (sccm); (5) a tetraethyl-ortho-silicate (TEOS) flow rate of from about 1600 to about 2400 standard cubic centimeters per minute (sccm); and (6) a helium carrier gas flow rate of from about 3000 to about 5000 standard cubic centimeters per minute (sccm).

Figure 3:
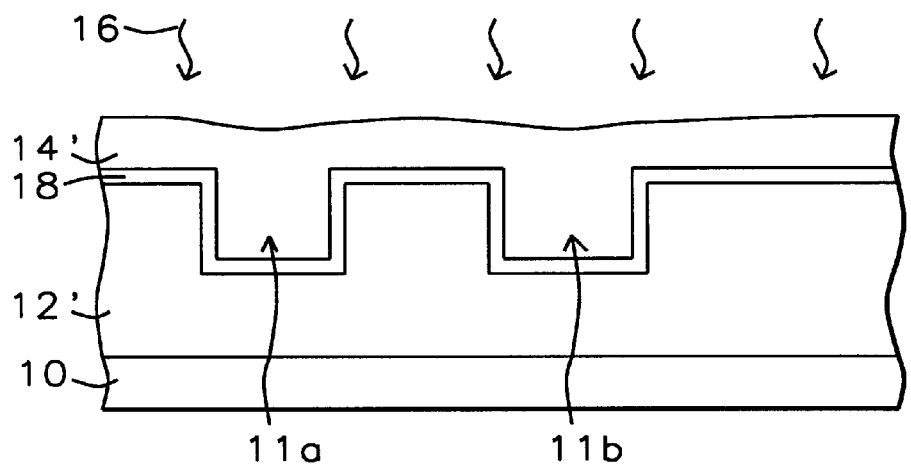

Referring now to FIG. 3, there is shown a schematic cross-sectional diagram illustrating the results of further processing of the microelectronics fabrication whose schematic cross-sectional diagram is shown in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the gap filling silicon oxide trench fill layer 14 has been thermally annealed within an oxidizing atmosphere 16 to form a densified thermally annealed gap fining silicon oxide trench fill layer 14' which is formed upon an interfacial silicon oxide layer 18 which is formed through partial consumption of the silicon layer 12 to simultaneously form the partially consumed silicon layer 12'.

With respect to the first preferred embodiment of the present invention, the oxidizing atmosphere 16 may be selected from a group of oxidizing atmospheres including but not limited to oxygen, ozone, nitrous oxide and nitric oxide oxidizing atmospheres. Preferably the oxidizing atmosphere consists of oxygen gas at a pressure of from about 600 to about 760 torr and the annealing temperature is from about 1000 to about 1100 degrees centigrade.

Figure 4:
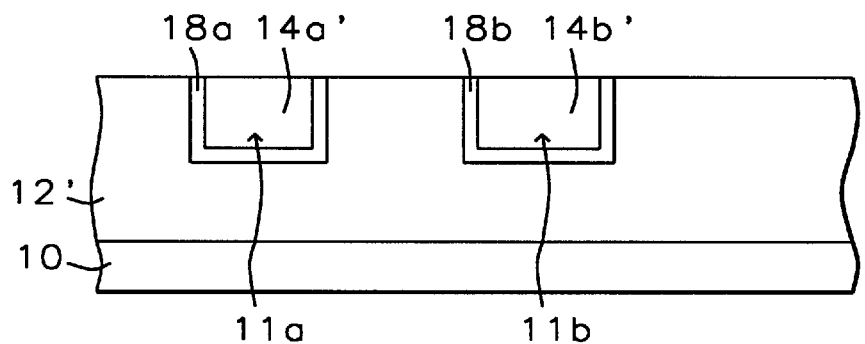

Referring now to FIG. 4, there is shown a schematic cross-sectional diagram illustrating the results of further processing of the microelectronics fabrication whose schematic cross-sectional diagram is shown in FIG. 3. Shown in FIG. 4 is the partially consumed silicon layer 12' otherwise equivalent to FIG. 3 but wherein the densified thermally annealed gap filling silicon oxide trench fill layer 14' has been planarized and removed by chemical mechanical polish (CMP) planarization to provide a co-planar surface consisting of the surface of the partially consumed silicon layer 12', a pair of patterned planarized densified thermally annealed gap filling silicon oxide trench fill layers 14a' and 14b' and a pair of patterned interfacial silicon oxide layers 18a and 18b within the trenches 11a and 11b.

Within the first preferred embodiment of the present invention, the chemical mechanical polish (CMP) planarization method employed preferably employs the process parameters including: (1) a platen pressure of from about 4 to about 8 pounds per square inch (psi); (2) a platen rotation speed of from about 20 to about 60 revolutions per minute (rpm); (3) a head counter-rotation speed of from about 20 to about 60 revolutions per minute (rpm); (4) a silicon substrate temperature of from about 20 to about 40 degrees centigrade; (5) an aqueous silica slurry concentration of from about 10 to about 20 weight percent; and (6) an aqueous slurry flow rate of from about 100 to about 200 cubic centimeters per minute (ccm).

Within the first preferred embodiment of the method of the present invention, the gap filling silicon oxide trench fill layer 14 has been formed on the silicon substrate and within the trenches 11a and 11b with attenuated surface sensitivity while achieving an enhanced bulk quality, since the gap filling silicon oxide trench fill layer 14 is formed employing an ozone assisted sub-atmospheric pressure thermal chemical vapor deposition (SACVD) method while being formed on a silicon surface and not on a thermal silicon oxide or silicon nitride surface.

Second Preferred Embodiment

Figure 5:
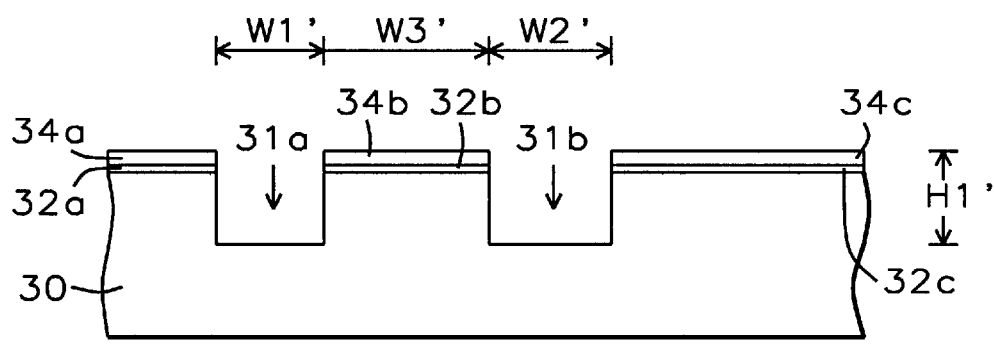
FIG. 5, FIG. 6, FIG. 7, FIG. 8 and FIG. 9 show a series of schematic cross-sectional diagrams illustrating the results of progressive stages in forming within a trench within a semiconductor substrate employed within an integrated circuit microelectronics fabrication a patterned planarized gap filling silicon oxide trench fill layer, while attenuating a surface sensitivity and while providing enhanced bulk quality and reduced trench recess at corners, in accord with a more specific embodiment of the present invention, which represents a second preferred embodiment of the present invention

Referring now to FIG. 5 to FIG. 9, there is shown a series of schematic cross-sectional diagrams illustrating the progression of various stages in the fabrication of an integrated circuit microelectronics fabrication in accord with a second preferred embodiment of the method of the present invention. Shown in FIG. 5 is a schematic cross-sectional diagram of the integrated circuit microelectronics fabrication at an early stage in its fabrication.

Shown in FIG. 5 is a schematic cross-sectional diagram of a silicon semiconductor substrate 30 upon which has been formed successively a series thermal silicon oxide pad oxide layers 32a, 32b and 32c and a series of silicon layers 34a, 34b and 34c through which has been formed a pair of isolation trenches 31a and 31b by methods conventional in the art of integrated circuit microelectronics fabrication. The pair of isolation trenches 31a and 31b are of width W1' and W2' separated by width W3' and of depth H1 ' analogous or equivalent to similar features in the schematic cross-sectional diagram of FIG. 1.

Within the second preferred embodiment of the method of the present invention, the silicon semiconductor substrate 30 may be of either polarity and various crystallographic orientations but preferably is (100) silicon with either N- or P-type doping.

Within the second preferred embodiment of the method of the present invention, the thermal silicon oxide pad oxide layers 32a, 32b and 32c are preferably formed on the silicon semiconductor substrate 30 by thermal oxidation in an oxidizing atmosphere at a temperature of from about 800 to about 1000 degrees centigrade for a period of from about 20 to about 40 minutes to form a silicon oxide thickness of from about 90 to about 200 angstroms. Within the second preferred embodiment of the method of the present invention, the silicon layers 34a, 34b and 34c are preferably formed by deposition of amorphous or polycrystalline silicon employing methods conventional in the microelectronics fabrication art to form the silicon layers 34a, 34b and 34c to a thickness of from about 1000 to about 2000 angstroms.

Figure 6:
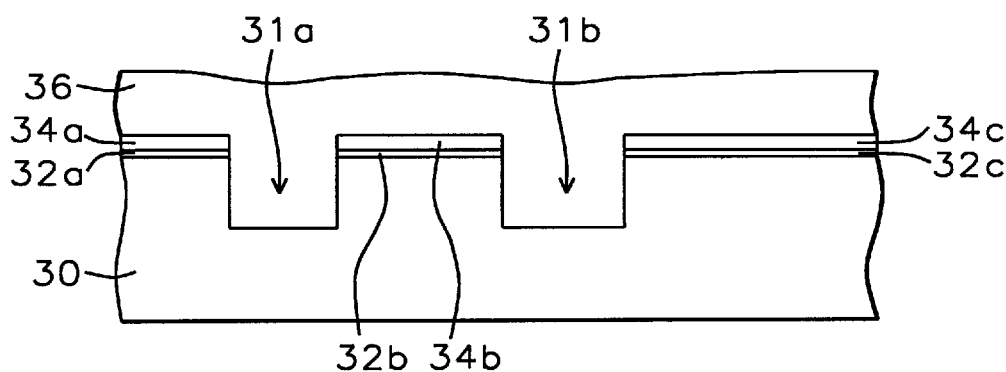

Referring now to FIG. 6, there is shown a schematic cross-sectional diagram illustrating a later stage in the fabrication of the integrated circuit microelectronics fabrication shown in FIG. 5. Shown in FIG. 6 is a schematic cross-sectional diagram of an integrated circuit microelectronics fabrication otherwise equivalent to FIG. 5, but wherein there has been formed upon the silicon semiconductor substrate 30 and within the pair of isolation trenches 31a and 31b a gap filling silicon oxide trench fill layer 36. The gap filling silicon oxide trench fill layer 36 is analogous to the gap filling silicon oxide trench fill layer 14 as illustrated in FIG. 2, and is formed employing analogous or equivalent methods and materials.

Figure 7:
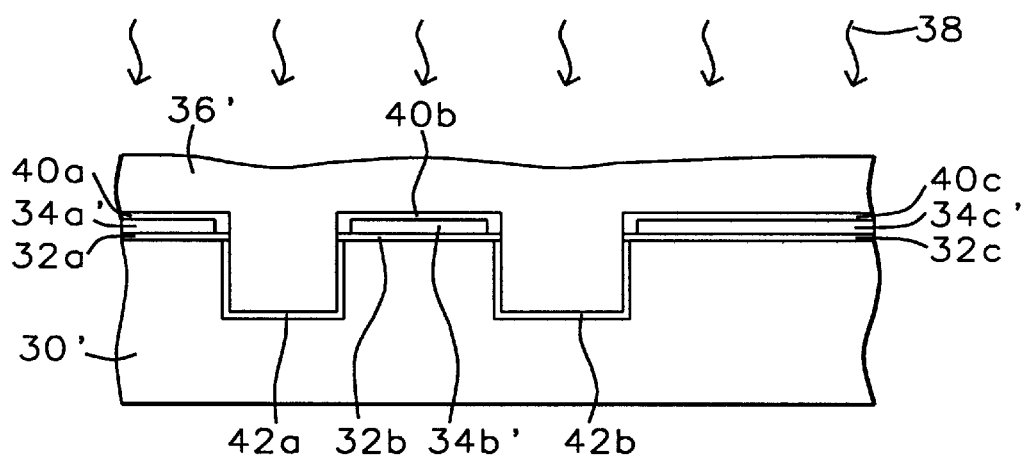

Referring now to FIG. 7, there is shown a schematic cross-sectional diagram illustrating a later stage in the fabrication of the integrated circuit microelectronics fabrication shown in FIG. 6. Shown in FIG. 7 is a schematic cross-sectional diagram of an integrated circuit microelectronics fabrication otherwise equivalent to FIG. 6, but wherein the gap filling silicon oxide trench fill layer 36 has been annealed in an oxidizing atmosphere 38 to form a densified thermally annealed gap filling silicon oxide trench fill layer 36' formed partly upon a series of silicon oxide layers 40a, 40b and 40c and partly on a pair of silicon oxide layers 42a and 42b formed by reaction of the silicon at the interfaces with the densified thermally annealed gap filling silicon oxide trench fill layer 36' with an oxidant 38. The oxidant 38 has diffused to the interfaces during the annealing of the gap filling silicon oxide trench fill layer 36'.

The gap filling silicon oxide trench fill layer 36' has been subjected to a densification process step in an oxidizing atmosphere for a time period of about 45 minutes at a densification temperature of from about 1000 to about 1100 degrees centigrade, resulting in diffusion of oxidant to the interface between the gap filling silicon oxide trench fill layer 36' and the silicon substrate 30 and reaction therewith of the silicon substrate 30 and silicon layers 34a, 34b and 34c to form a partially consumed silicon substrate 30' and partially consumed silicon layers 34a', 34b' and 34c' to form additional silicon oxide at that interface. The oxidation rates of polycrystalline or amorphous silicon are greater than the oxidation rate for single crystal silicon and hence greater thicknesses are formed for silicon oxide layers 40a, 40b and 40c as compared to thicknesses for silicon oxide layers 42a and 42b at the sides and bottoms of the isolation trenches 31a and 31b.

With respect to the second preferred embodiment of the method of the present invention, the methods and materials employed for the annealing and densification of the gap filling silicon oxide trench fill layer 36 are analogous or equivalent to those methods and materials employed in the annealing and densification of the gap filling silicon oxide trench fill layer 14 of FIG. 2.

Figure 8:
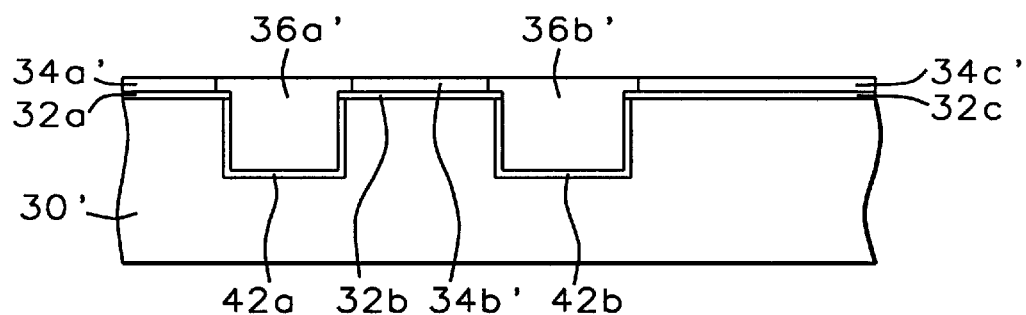

Referring now to FIG. 8, there is shown a schematic cross-sectional diagram illustrating a later stage in the fabrication of the integrated circuit microelectronics fabrication whose schematic cross-sectional diagram is shown in FIG. 7. Shown in FIG. 8 is a schematic cross-sectional diagram illustrating the results of planarization of the gap filling silicon oxide trench fill layer formed upon the partially consumed silicon substrate 30' and the partially consumed silicon layers 34a', 34b' and 34c' and within the pair of trenches 31a and 31b within the partially consumed silicon substrate 30' and the partially consumed silicon layers 34a', 34b' and 34c'. In FIG. 8, the region of the planarized gap filling silicon oxide trench fill layers 36a' and 36b' and the adjoining partially consumed silicon layers 34a', 34b' and 34c' have been rendered co-planar by a chemical mechanical polish (CMP) planarization method analogous or equivalent to that employed in forming from the microelectronics fabrication of FIG. 3 the microelectronics fabrication of FIG. 4. The chemical mechanical polish (CMP) planarizing process is completed and brought to a stop by the non-reactive nature of the partially consumed silicon layers 34a', 34b' and 34c' to the chemical mechanical polish (CMP) planarizing process.

Figure 9:
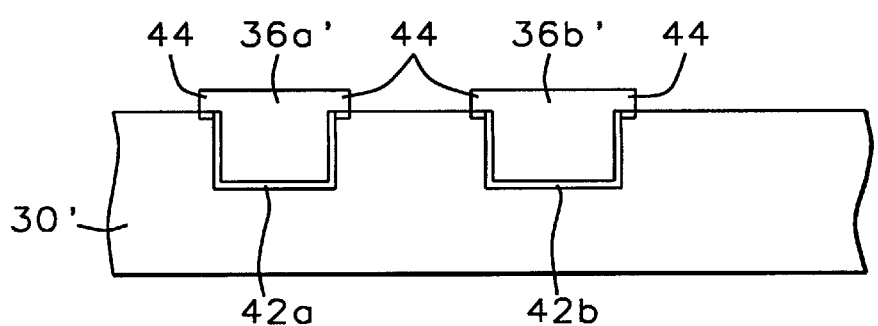

Referring now to FIG. 9, there is shown a schematic cross-sectional diagram illustrating the final stage of further processing of the partially consumed silicon semiconductor substrate 30' whose schematic cross-sectional diagram is illustrated in FIG. 8. Shown in FIG. 9 is the final result of stripping of the partially consumed silicon layers 34a', 34b' and 34c' and the silicon oxide pad oxide layers 32a and 32b by conventional means employed in the art of microelectronics fabrication. The patterned planarized gap filling silicon oxide trench fill layers 36a' and 36b' within the pair of trenches 31a and 31b show an improved vertical profile because of the partial consumption of silicon semiconductor substrate 30 and the partial consumption of the silicon layers 34a, 34b and 34c to form additional silicon oxide which has been removed by the chemical mechanical polish (CMP) planarization method, resulting in overhanging of edges 44 which are advantageous to further processing by the conventional art of microelectronics fabrication because of the reduction of corner and edge recession at a subsequent wet dip etching step.

With respect to the second preferred embodiment of the present invention, the formation of silicon oxide at the interface of the partially consumed silicon substrate 30' and the partially consumed silicon layers 34a', 34b' and 34c' with the densified gap filling silicon oxide trench fill layer 36' is desirable in that there is achieved a consumption of the edges of the partially consumed silicon layers 34a', 34b' and 34c' by thermal growth when forming the series of thermal silicon oxide layers 40a, 40b and 40c, in conjunction with subsequent planarization of the thermal silicon oxide layers 40a, 40b and 40c during the final processing stage of the partially consumed silicon semiconductor substrate 30' whose schematic cross-sectional diagram is illustrated in FIG. 9. The etching and removal of the silicon oxide results in an overhang of the edges of the silicon oxide layer 44. Such edge features are often found to be advantageous in integrated circuit microelectronics fabrications with respect to defect reduction and yield enhancement.

With respect to the second preferred embodiment of the method of the present invention, the ozone assisted subatmospheric pressure thermal chemical vapor deposition (SACVD) method of forming the gap filling silicon oxide trench fill layer is accomplished with attenuated surface sensitivity and while achieving an enhanced bulk quality over both the silicon substrate and the silicon layer as a consequence of the absence of thermal silicon oxide or silicon nitride either on or within the exposed surfaces of the trenches.

EXAMPLES

With respect to the preferred embodiments of the method of the present invention, the merits of the present invention are illustrated by the following examples. The thermal annealing and densification process after formation of gap filling silicon oxide trench fill layer employing an ozone assisted subatmospheric pressure thermal chemical vapor deposition (SACVD) method using TEOS gas as a silicon source was carried out in nitrogen gas environment at an elevated temperature and compared to the results similarly obtained with oxygen gas. Experimental samples consisting of silicon substrates analogous or equivalent to the silicon substrate 30 shown in FIG. 5 of the second preferred embodiment of the method of the present invention were prepared by forming upon them blanket gap filling silicon oxide trench fill dielectric layers analogous or equivalent to the gap filling silicon oxide trench fill layers 36 shown in FIG. 6 of the second preferred embodiment of the method of the present invention. The experimental samples were thermally annealed in various atmospheres employing conditions analogous or equivalent to those described in conjunction with FIG. 7 of the second preferred embodiment of the method of the present invention. Similarly, silicon substrates upon which were formed layers of silicon nitride prior to deposition of the gap filling silicon oxide trench fill layer were employed to measure the effect of subsequent thermal annealing and densification of the gap filling silicon oxide trench fill layer, since in these samples the thermal annealing and densification step cannot form any additional silicon oxide.

The results are shown in Table I, which compares the ratio of the etch rate of the gap filling silicon oxide trench fill layers in dilute hydrofluoric acid for each annealing and densification environment to that of thermal silicon oxide. Also shown in Table I is the amount of silicon oxide grown at the interface where the silicon has interacted with the oxidizing environment during the annealing and densification process. The nitrogen environment has formed no silicon oxide at the interface and hence consumed no silicon of any kind, compared to the consumption of silicon to form silicon oxide at the interface which occurred in an oxygen environment wherein the amount of silicon oxide and hence the amount of silicon consumed is proportional to the time of exposure to the oxygen environment.

TABLE I

| Densification Environment | Etch Rate Ratio | Silicon Oxide Growth At Interface, angstroms |
|---|---|---|
| O2, 1100 C, 30 min | 1.14 | 180 |
| O2, 1100 C, 120 min | 1.08 | 571 |
| N2, 1100 C, 120 min | 1.16 | 0 |

The annealing in nitrogen provides no formation of silicon oxide at the interface between the deposited gap fining silicon oxide trench fill layer and the silicon substrate, whereas the annealing in oxygen provides additional silicon oxide formation rate due to oxidation of the silicon substrate and an amount of densification which increases with increasing time of annealing in oxygen.

With respect to the formation of gap filling silicon oxide trench fill dielectric layers employing an ozone assisted subatmospheric pressure thermal chemical vapor deposition (SACVD) method upon silicon oxide and silicon nitride layers as is conventional in the art of microelectronics fabrication, there is observed no surface sensitivity wherein results a lower deposition rate and a lower quality of silicon oxide on these surfaces. The method of the present invention obviates this surface sensitivity by forming the gap filling silicon oxide trench fill layer on a silicon surface wherein there is no surface sensitivity to cause a lower deposition rate or a lesser quality of the silicon oxide layer.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for filling a trench within a substrate, comprising the steps of;

providing a substrate, the substrate including an upper silicon layer; the silicon containing layer not being comprised of either silicon nitride or thermally formed silicon oxide;

the silicon containing layer having a trench formed therein;

the silicon containing layer having a thickness which is greater than a depth of said trench;

forming upon the silicon containing layer and within the trench therein a gap filling silicon oxide trench fill layer formed employing a sub-atmospheric pressure thermal chemical vapor deposition (SACVD) method employing an ozone oxidant and a tetra-ethyl-ortho-silicate (TEOS) silicon source material; and densifying the gap filling silicon oxide trench fill layer by annealing in an oxidizing atmosphere at an elevated temperature.

2. The method of claim 1 wherein the densification of the gap filling silicon oxide trench fill layer is carried out in an oxidizing atmosphere at a pressure of from about 600 to about 760 torr for a period of from about 30 to about 60 minutes at a temperature of from about 1000 to about 1100 degrees centigrade.

3. The method of claim 1 wherein the oxidizing atmosphere is selected from the group consisting of oxygen, ozone, nitrous oxide, nitric oxide and mixtures thereof.

4. The method of claim 1 wherein the width of the trench is greater than about 0.3 microns and the depth of the trench is from about 3000 to about 5000 angstroms.

5. The method of claim 1 wherein the ozone assisted sub-atmospheric pressure thermal chemical vapor deposition (SACVD) method employs a reactor chamber pressure of from about 450 to about 600 torr and an ozone: TEOS volume ratio of from about 8:1 to about 14:1.

6. The method of claim 1 further comprising planarizing the gap filling silicon oxide trench fill layer.

7. A method for filling a trench within a substrate, comprising the steps of;

providing a silicon semiconductor substrate, the silicon semiconductor substrate including an upper silicon layer; the silicon containing layer not being comprised of either silicon nitride or thermally formed silicon oxide;

the silicon containing layer having an isolation trench formed therein;

the silicon containing layer having a thickness which is greater than a depth of said isolation trench;

forming upon the silicon containing layer and within the isolation trench therein a gap filling silicon oxide trench fill layer formed employing a sub-atmospheric pressure thermal chemical vapor deposition (SACVD) method employing an ozone oxidant and a tetra-ethyl-ortho-silicate (TEOS) silicon source material; and densifying the gap filling silicon oxide trench fill layer by annealing in an oxidizing atmosphere at an elevated temperature.

8. The method of claim 7 wherein the densification of the gap filling silicon oxide trench fill layer is carried out in an oxidizing atmosphere at a pressure of from about 600 to 760 torr for a period of from about 30 to 60 minutes at a temperature of from about 1000 to about 1100° C.

9. The method of claim 7 wherein the oxidizing atmosphere is selected from the group consisting of oxygen, ozone, nitrous oxide, nitric oxide and mixtures thereof.

10. The method of claim 7 wherein the width of the trench is greater than about 0.3 microns and the depth of the trench is from about 3000 to about 5000 Å.

11. The method of claim 7 wherein the ozone assisted SACVD method employs a reactor chamber pressure of from about 450 to about 600 torr and an ozone: TEOS volume ratio of from about 8:1 to about 14:1.

12. The method of claim 7 further comprising planarizing the gap filling silicon oxide trench fill layer.

13. A method for filling a trench within a substrate, comprising the steps of;

providing a substrate, the substrate including an upper silicon layer; the silicon containing layer not being comprised of either silicon nitride or thermally formed silicon oxide;

the silicon containing layer having a trench formed therein;

the silicon containing layer having a thickness which is greater than a depth of said trench;

forming upon the silicon containing layer and within the trench therein a gap filling silicon oxide trench fill layer formed employing a sub-atmospheric pressure thermal chemical vapor deposition (SACVD) method employing an ozone oxidant and a tetra-ethyl-ortho-silicate (TEOS) silicon source material; and densifying the gap filling silicon oxide trench fill layer by annealing in an oxidizing atmosphere at an elevated temperature of from about 1000 to 1100° C. for a period of from about 30 to 60 minutes; the oxidizing atmosphere being selected from the group consisting of oxygen, ozone, nitrous oxide, nitric oxide and mixtures thereof.

14. The method of claim 13 wherein the substrate is a silicon semiconductor substrate and the trench is an isolation trench within the silicon containing layer.

15. The method of claim 13 wherein the width of the trench is greater than about 0.3 microns and the depth of the trench is from about 3000 to about 5000 Å.

16. The method of claim 13 wherein the ozone assisted SACVD method employs a reactor chamber pressure of from about 450 to about 600 torr and an ozone: TEOS volume ratio of from about 8:1 to about 14:1.

17. The method of claim 13 further comprising planarizing the gap filling silicon oxide trench fill layer.

* * * * *